United States Patent
Pinsero et al.

(10) Patent No.: US 12,132,487 B2
(45) Date of Patent: Oct. 29, 2024

(54) SIGNAL GENERATOR CIRCUIT, CORRESPONDING DEVICE AND METHOD

(71) Applicant: STMicroelectronics S.r.l., Agrate Brianza (IT)

(72) Inventors: Marco Pinsero, Milan (IT); Marco Attanasio, Olbia-Tempio (IT); Alberto Cattani, Cislago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 206 days.

(21) Appl. No.: 17/964,420

(22) Filed: Oct. 12, 2022

(65) Prior Publication Data

US 2023/0128113 A1 Apr. 27, 2023

(30) Foreign Application Priority Data

Oct. 21, 2021 (IT) .......................... 102021000027083

(51) Int. Cl.
*H03K 4/50* (2006.01)
(52) U.S. Cl.
CPC ....................................... *H03K 4/50* (2013.01)
(58) Field of Classification Search
CPC ............... H03K 4/08; H03K 4/48; H03K 4/50
USPC .......................... 327/131, 132, 134, 135, 137
See application file for complete search history.

(56) References Cited

U.S. PATENT DOCUMENTS

| 5,760,623 A | * | 6/1998 | Hastings | ................ | H03K 4/502 327/135 |
| 6,577,109 B2 | | 6/2003 | Dancy et al. | | |
| 2008/0252391 A1 | | 10/2008 | Neidorff | | |

OTHER PUBLICATIONS

IT Search Report and Written Opinion for priority application, IT 102021000027083, report dated May 31, 2022, 8 pgs.

* cited by examiner

*Primary Examiner* — William Hernandez
(74) *Attorney, Agent, or Firm* — Crowe & Dunlevy LLC (57) ABSTRACT

In start-up, current is sourced by a current source to a first plate of a first capacitor while a second capacitor is maintained at zero charge. In a subsequent first operating phase, current is sourced to a first plate of the second capacitor while a second plate of the first capacitor is connected to the first plate of the second capacitor. At the end of the first operating phase, the first capacitor is discharged. In a subsequent second operating phase, current is sourced to the first plate of the first capacitor while a second plate of the second capacitor is connected to the first plate of the first capacitor. At the end of the second operating phase, the second capacitor is discharged. Steady state operation of the circuit involves an alternation of the first and second operating phases interleaved with transition phases where the first and second capacitors are discharged.

31 Claims, 7 Drawing Sheets

SIGNAL GENERATOR CIRCUIT, CORRESPONDING DEVICE AND METHOD

PRIORITY CLAIM

This application claims the priority benefit of Italian Application for Patent No. 102021000027083, filed on Oct. 21, 2021, the content of which is hereby incorporated by reference in its entirety to the maximum extent allowable by law.

TECHNICAL FIELD

The description relates to circuits for generating signals such as clock and ramp signals.

One or more embodiments can be advantageously applied, for instance, in power management integrated circuit (PMIC) DC-DC converters. Active-matrix organic light emitting diode (AMOLED) display devices are an example of devices where embodiments as discussed herein can be advantageously applied.

BACKGROUND

An issue likely to arise in circuits such as converter circuits is related to generating two ramp signals (and their synchronous clocks) shifted in time by half period.

An approach currently resorted to for that purpose involves using a first master oscillator operated at a double frequency and two separated slave ramp generators.

The related circuit topology, which involves three oscillators, is area and power demanding.

There is a need in the art to address the issues discussed above.

SUMMARY

One or more embodiments relate to a circuit.

One or more embodiments relate to a corresponding device. A DC-DC converter for use in AMOLED display units may be exemplary of such a device.

One or more embodiments relate to a corresponding method of operation.

One or more embodiments provide a self-sustained structure generating two ramps from a single current.

In one or more embodiments, a first capacitor (uncharged at turn-on) is connected in a start-up phase (PHASE 0) to a current source while a second capacitor is maintained at zero charge. In this situation, a signal at a first node rises linearly while a second node remains at zero.

In a subsequent phase (PHASE 1), the first capacitor is separated from the source (and caused to store voltage a (e.g., 300 mV) across its terminals) while the second capacitor is connected to the current source. A bottom plate of the first capacitor is connected to the second node while the upper plate is left floating. The second node rises (from, e.g., 0 to 300 mV) while the first node completes a swing (from, e.g., 300 mV to 600 mV) maintaining a T/2 shift from the second signal.

In a further phase (PHASE 2, after having discharged the first capacitor) the second capacitor is separated from the source (and caused to store a voltage (e.g., 300 mV) across its terminals) and the first capacitor is again recharged via the current source while a bottom plate of the second capacitor is connected to the first node and the upper plate is floating, thus promoting a situation mirroring the situation during the earlier phase.

Operation then returns (advantageously, after having discharged the second capacitor) to PHASE 1, giving rise to an alternation of the two phases (PHASE 1, PHASE 2, with capacitor discharge therebetween).

One or more embodiments provide a dual-phase architecture suited to be integrated in a converter, with the two phases having a fixed time shift therebetween.

One or more embodiments may include a single block driving plural clocks and ramps.

As noted, examples as presented herein comprise two (additional) transition phases introduced between the two phases discussed previously (PHASE 1, PHASE 2) to adequately reset the capacitors in a controlled way. This facilitates generating clock signals with a fixed duty-cycle (this is adjustable changing a threshold), which in a DC-DC converter fixes a maximum "on" period for a high-side switch, for instance.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Also, for the sake of simplicity and ease of explanation a same reference symbol/designation (e.g., R1, R2) can be used throughout this description to designate both a circuit node or line and a signal occurring at that node or line.

Two-phase peak-current DC-DC converters are widely used in state-of-the-art applications such as power management integrated circuit (PMIC) DC-DC converters in AMO-LED products, for instance.

Such converters can include two different coils operating in parallel; this facilitates delivering very high average currents.

A peak-current DC-DC converter includes a synchronized clock, a finite state machine and a voltage ramp signal to ensure loop stability. Therefore, in two-phase converters two clocks and two ramps shifted in time by half period are generated in order to minimize the voltage ripple at the converter output.

Figure 1A:
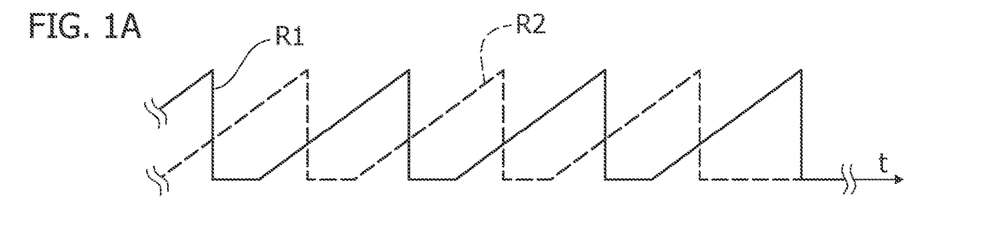
FIGS. 1A and 1B are exemplary of possible time behaviors of clock and ramp signals.
Figure 1B:
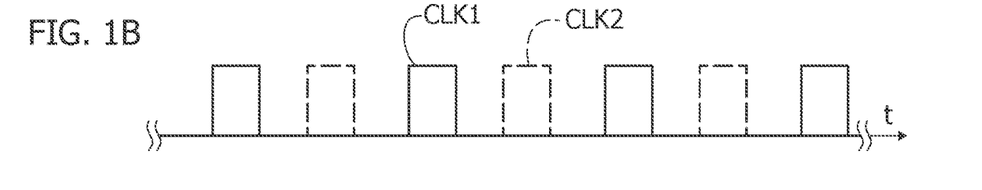

The diagrams of FIGS. 1A and 1B are exemplary of possible time behaviors, plotted against a common (abscissa) time scale t of two such ramp signals R1, R2 and two corresponding clock signals CLK1, CLK2.

Generation of these ramp and clock signal desirably exhibit the following features: the two ramps R1, R2 have the same frequency; the two clocks have a same duty-cycle; and the clock frequency is trimmable.

Controllability of the duty-cycle of the clock signal is another desirable feature insofar as this facilitates, e.g., defining the maximum TON value of an associated converter.

It is recalled that a square (rectangular) wave such as the clock signals CLK1, CLK2 in FIG. 1B can be regarded as a pulse-width modulated (PWM) signal with an alternation of "on" times (signal high) with a duration TON and "off" times (signal low) with a duration TOFF. The sum TON+TOFF identifies the period of the signal having a frequency 1/(TON+TOFF) and the ratio TON/(TON+TOFF) identifies the duty-cycle of the signal.

The generation of these signals may be highly area-consuming and power-consuming, which results in reduced efficiency and higher manufacturing costs.

Figure 2:
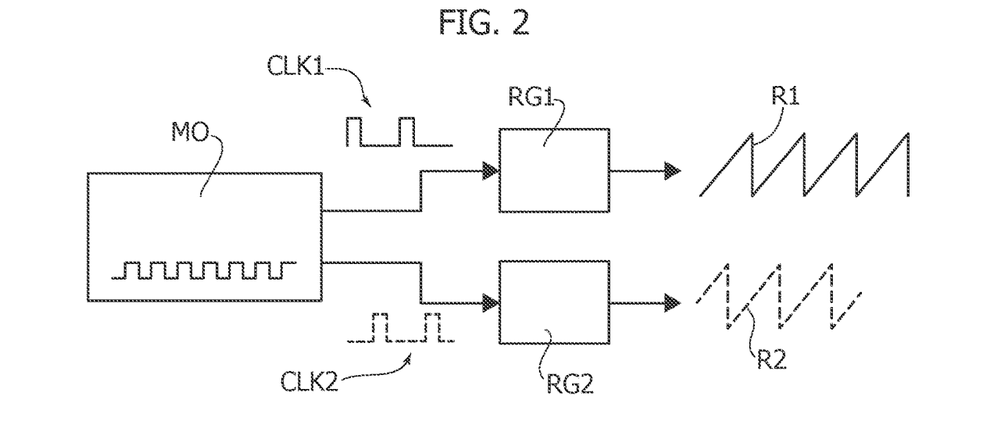
FIG. 2 is a block diagram of a circuit for producing clock and ramp signals as exemplified in FIGS. 1A and 1B.

For instance, FIG. 2 illustrates a circuit where two (counter-phase) clocks CLK1, CLK2 and two corresponding ramps R1, R2 are generated with a "master" oscillator MO providing a square wave at, e.g., 3 MHz.

From that square wave, two clock signals CLK1, CLK2 are derived, at, e.g., 1.5 MHz. The oscillator MO thus operates at a frequency twice the frequency of the signals CLK1, CLK2 as possibly supplied to a converter (not visible in the figure).

Corresponding ramp signals R1 and R2 are generated from the clock signals CLK1, CLK2 via ramp generators RG1, RG2.

Figure 3:
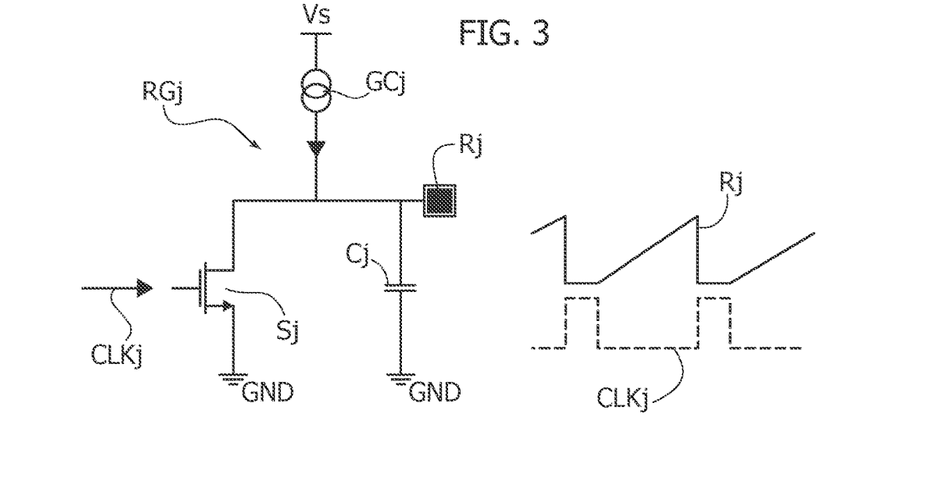
FIG. 3 is a general representation of the generation of ramp signals.

As exemplified in FIG. 3, each ramp generator RGj (j=1, 2) may include to that effect a current generator CGj coupled to a supply line or node Vs and injecting its current into the parallel connection of a switch Sj (for instance, this may be a MOSFET transistor configured to be made conductive/non-conductive by the signal CLKj applied to its gate) and a capacitor Cj.

For instance, the duty-cycle of the clock signals CLK1, CLK2 is adjusted to be equal to, e.g., 10%, and the clock signal CLKj (j=1, 2) applied as a current seed injected into the capacitor Cj when the clock signal CLKj is low (with the switch non-conductive) and its voltage re-initialized to GND.

It is noted that, in the circuit illustrated in FIG. 2, mismatches and process variations may result in two ramps R1, R2 being generated that cannot ensure a same final voltage value. An auto-trimming process may address this issue which may involve implementing two comparators for each ramp.

The circuit as illustrated in FIG. 2, thus exhibits various disadvantages, such as: a high power consumption in so far as three different current "seeds" are involved in generating the oscillator and the two ramps, respectively; and a high area occupation due to the implementation of a master clock MO and four auto-trimming comparators and related logic.

Power and area specifications for devices such as PMICs are made increasingly strict. New solutions suited to facilitate efficient chip design without compromising performance are thus desirable.

Figure 4:
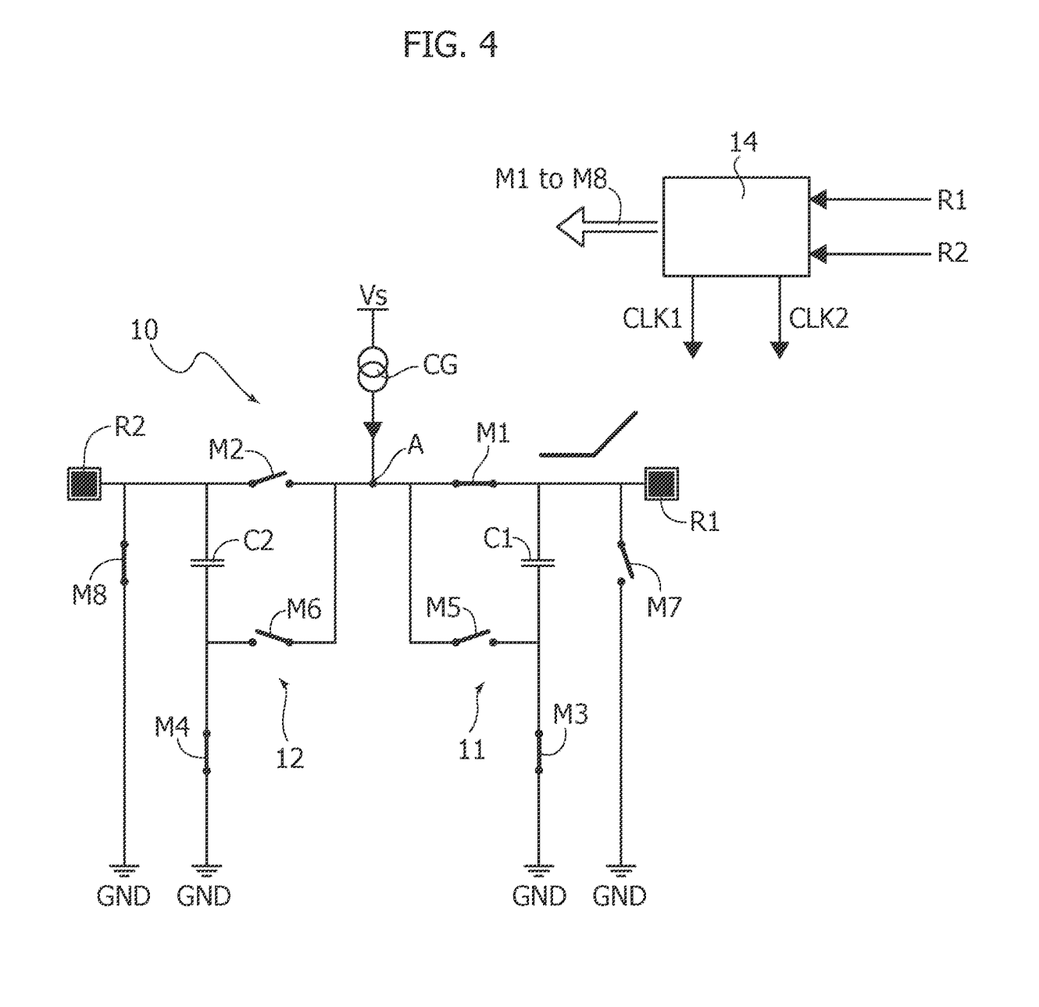
FIG. 4 is exemplary of a phase of operation of a circuit according to embodiments of the present description.

The examples presented herein starting from FIG. 4 address the issues discussed in the foregoing replacing three-block architecture as illustrated in FIG. 2 with an "all-in-one" circuit 10 providing improved silicon area and bias current (e.g., efficiency) characteristics.

It will be noted that corresponding numerals and symbols in the different figures generally refer to corresponding parts unless otherwise indicated. For brevity, a detailed description will not be repeated for each and every figure; also, parts or elements like parts or elements already described in connection with FIGS. 1, 1B, 2 and 3 will be indicated in FIG. 4 and the following figures with like numerals and symbols and a corresponding detailed description will not be repeated. Furthermore, a same reference symbol/designation (e.g., R1, R2) can be used throughout this description to designate both a circuit node or line and a signal occurring at that node or line.

While exhibiting at first sight some similarities, the circuit of the examples presented herein differs from a charge pump for a number of basic features: capacitors in a charge pump are charged at a certain voltage, not via a current generator; and signals in charge pump are square waves between a voltage VIN and a voltage 2*VIN, not a linear voltage ramp.

In fact, the purpose of a charge pump is to double a voltage (or, more generally to create a higher voltage rail) and not to generate clocks and ramps.

Briefly, a circuit 10 as illustrated, e.g., in FIG. 4, comprises a current generator CG (of a type known per se to those of skill in the art) of a (constant) current of intensity I coupled to a supply node at a voltage Vs and configure to inject its current (at a current node designated A) into the parallel connection of two circuit branches 11 and 12 arranged between the node A and ground GND.

The circuit branch 11 comprises a first switch M1 intermediate the node A and a first output node R1 at which a first output (ramp) signal is collected. The circuit branch 12 comprises a second switch M2 intermediate the node A and a second output node R2 at which a second output (ramp) signal is collected. The circuit branch 11 further comprises a first capacitor C1 having a first ("top") plate coupled to the output node R1 (that is, to the first switch M1) and a second ("bottom") plate coupled to a third switch M3 referred to ground GND, so that the third switch M3, when closed, couples to ground GND the bottom plate of the first capacitor C1. The circuit branch 12 further comprises a second capacitor C2 (this may be assumed to have the same capacitance value of the capacitor C1) having a first ("top") plate coupled to the output node R2 (that is, to the second switch M2) and a second ("bottom") plate coupled to a fourth switch M4 referred to ground GND so that the fourth switch M4, when closed, couples to ground GND the bottom plate of the second capacitor C2. The circuit branch 11 also comprises a fifth switch M5 intermediate the node A and the line coupling the first capacitor C1 and the third switch M3. The circuit branch 12 also comprises a sixth switch M6 intermediate the node A and the line coupling the second capacitor C2 and the fourth switch M4. The circuit branch 11 further comprises a seventh switch M7 intermediate the first output node R1 and ground GND. The circuit branch 12 further comprises an eight switch M8 intermediate the second output node R2 and ground GND.

The switches M1 to M8 can be implemented as electronic switches such as, e.g., using a MOSFET transistor that can be made alternatively conductive (closed or "on") and non-conductive (open or "off") as a function of a control signal (e.g., high>>>conductive, low>>>non-conductive) applied to the control terminal (the gate, in the case of a MOSFET transistor) of the switch. Other possible implementations of the (electronic) switches M1 to M8 are known to those of skill in the art.

Operation, that is, making conductive ("on") or non-conductive ("off") the switches M1 to M8 is controlled by control circuitry 14 including comparators and control logic that is sensitive to the ramp signals R1, R2 at the homologous output nodes.

The circuitry 14 is configured (in a manner known per se to those of skill in the art) to make the switches M1 to M8 conductive/non-conductive according to the criteria exemplified in the following.

In a start-up phase (designated PHASE 0 and illustrated in FIG. 4: this is a start-up phase that occurs only at the turn on of the circuit 10) the capacitor C2 (as exemplified herein, the capacitors C1 and C2 have the same capacitance, C1=C2, for simplicity) is maintained at zero by the switches M4 and M8—both conductive—and the capacitance C1, assumed to have no charge thereon at circuit turn-on, is charged by the constant current generator CG via the switches M1 and M3—both conductive—to a voltage of, e.g., 300 mV (this is a purely exemplary value, of course).

Figure 5:
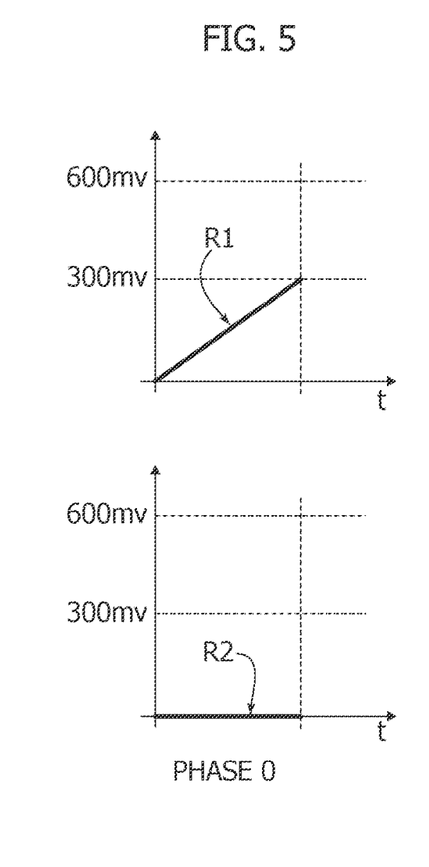
FIG. 5 comprises two diagrams exemplary of possible time behaviors of signals produced in the phase of operation illustrated in FIG. 4.

Corresponding time behaviors for the ramp signals R1 and R2 are illustrated in the diagrams of FIG. 5 (signal R1 in the upper diagram and signal R2 in the lower diagram) that share a common abscissa time scale t.

The voltage at the node R1 thus rises linearly with a slope proportional to I/C1 (where I denotes the intensity of the current from the generator CG and C1 is the capacitance value of the first capacitor) while the node R2 is kept at zero.

In response to the first ramp signal R1 reaching a first ("half-dynamics") threshold value (e.g., 300 mV) the comparator circuitry 14 is triggered and the system evolves to a next operation phase.

In this phase (designated PHASE 1 and illustrated in FIG. 6), the first capacitor C1 is de-coupled from the current path (both switches M1 and M3 are opened, that is, made non-conductive, by the circuitry 14) and the second capacitor C2 is coupled to the current source CG in response to the switches M2 and M4 being made conductive (closed) by the circuitry 14. The bottom plate of the first capacitor C1 is connected to the second output node R2 (via the switches M2 and M5 conductive) while the upper plate of the first capacitor C1, coupled to the first output node R1, is left floating.

Figure 6:
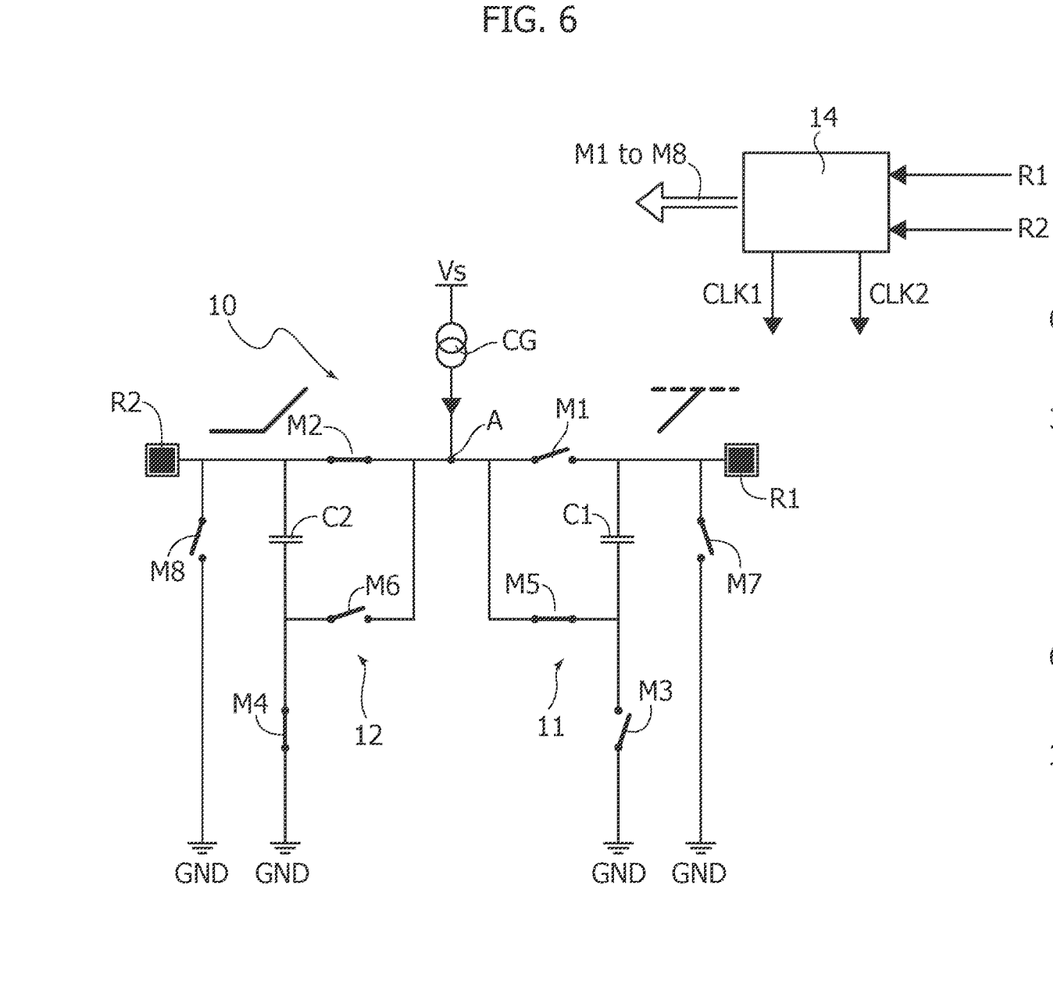
FIG. 6 is exemplary of a further phase of operation of a circuit according to embodiments of the present description.

In these conditions, having no discharge path available, the first capacitor C1 will preserve the previous charge voltage (e.g., 300 mV) stored at its terminals.

During PHASE 1, the voltage at the second output node R2 will rise linearly from zero with a slope proportional to I/C1=I/C2 (where I is the intensity of the current from the generator CG and C1=C2 is the capacitance value of the capacitors C1 and C2) and the voltage at first output node R1 will increase from its previous value (e.g., 300 mV) with the same slope of the signal R2.

Figure 7:
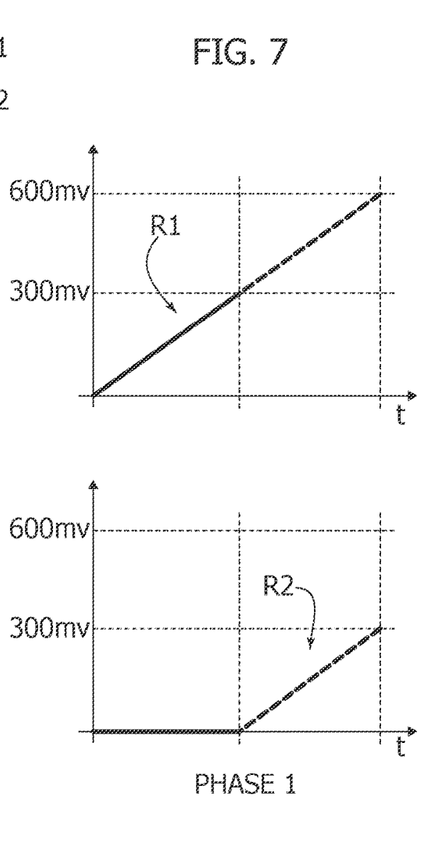
FIG. 7 comprises two diagrams exemplary of possible time behaviors of signals produced in the phase of operation illustrated in FIG. 6.

Corresponding time behaviors for the ramp signals R1 and R2 are illustrated in the diagrams of FIG. 7 (signal R1 in the upper diagram and signal R2 in the lower diagram) that share a common abscissa time scale t.

In response to the first ramp signal R1 reaching a second ("full-dynamics") threshold value (e.g., 600 mV) the comparator circuitry 14 is triggered again and the system evolves to a next operation phase.

As illustrated, this involves the first capacitor C1 being (completely) discharged with the switches M3 and M7 made conductive (closed) for a short time, with the circuit evolving towards a further operation phase.

Figures 8, 9:
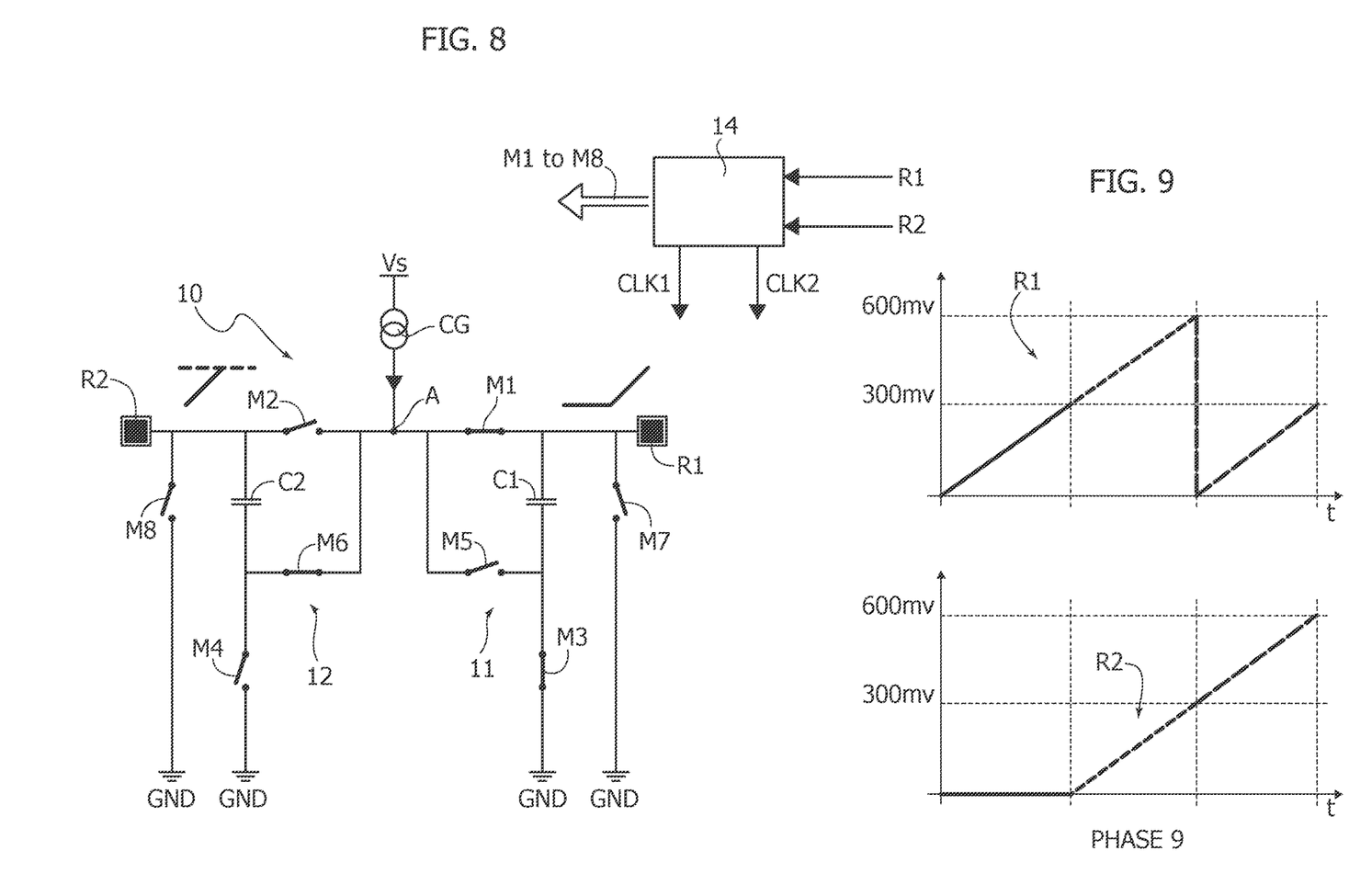
FIG. 8 is exemplary of a still further phase of operation of a circuit according to embodiments of the present description.
FIG. 9 comprises two diagrams exemplary of possible time behaviors of signals produced in the phase of operation illustrated in FIG. 8.

In this phase (this phase, designated PHASE 2, is illustrated in FIG. 8 and can be regarded as symmetrical with respect to PHASE 1 in FIG. 6) the second capacitor C2 is decoupled from the current path (switches M2 and M4 opened, that is non-conductive) and the first capacitor C1 (previously discharged via the switches M3 and M7) is coupled again to the current source CG in response to the switches M1 and M3 being closed (made conductive).

Then the bottom plate of the second capacitor C2 is coupled to the first output node R1 (via the switches M1 and M6 made conductive, that is closed) while the upper plate of the second capacitor C2 (coupled to the second output node R2) is left floating.

In this phase the voltage at the first output node R1 will rise linearly from zero with a slope proportional to I/C1=I/C2 where I is the intensity of the current from the generator CG and C1=C2 is the capacitance value of the capacitors C1 and C2) while the voltage at the second output node R2 will rise too from its previous value, e.g., 300 mV with the same slope as the first output signal R1.

Corresponding time behaviors for the ramp signals R1 and R2 are again illustrated in the diagrams of FIG. 9 (signal R1 in the upper diagram and signal R2 in the lower diagram) that share a common abscissa time scale t.

In response to the second ramp signal R2 reaching a (second) threshold value (this can be assumed to be the second "full-dynamics" value, e.g., 600 mV) the comparator circuitry 14 is triggered again to discharge (completely) the capacitor C2 with the switches M4 and M8 closed (that is, made conductive) for a short tiFphase1me and the circuit evolves towards PHASE 1 (FIG. 6) again.

As noted, PHASE 0 illustrated in FIG. 4 is a start-up phase intended to occur only at the turn on of the circuit.

Figure 10:
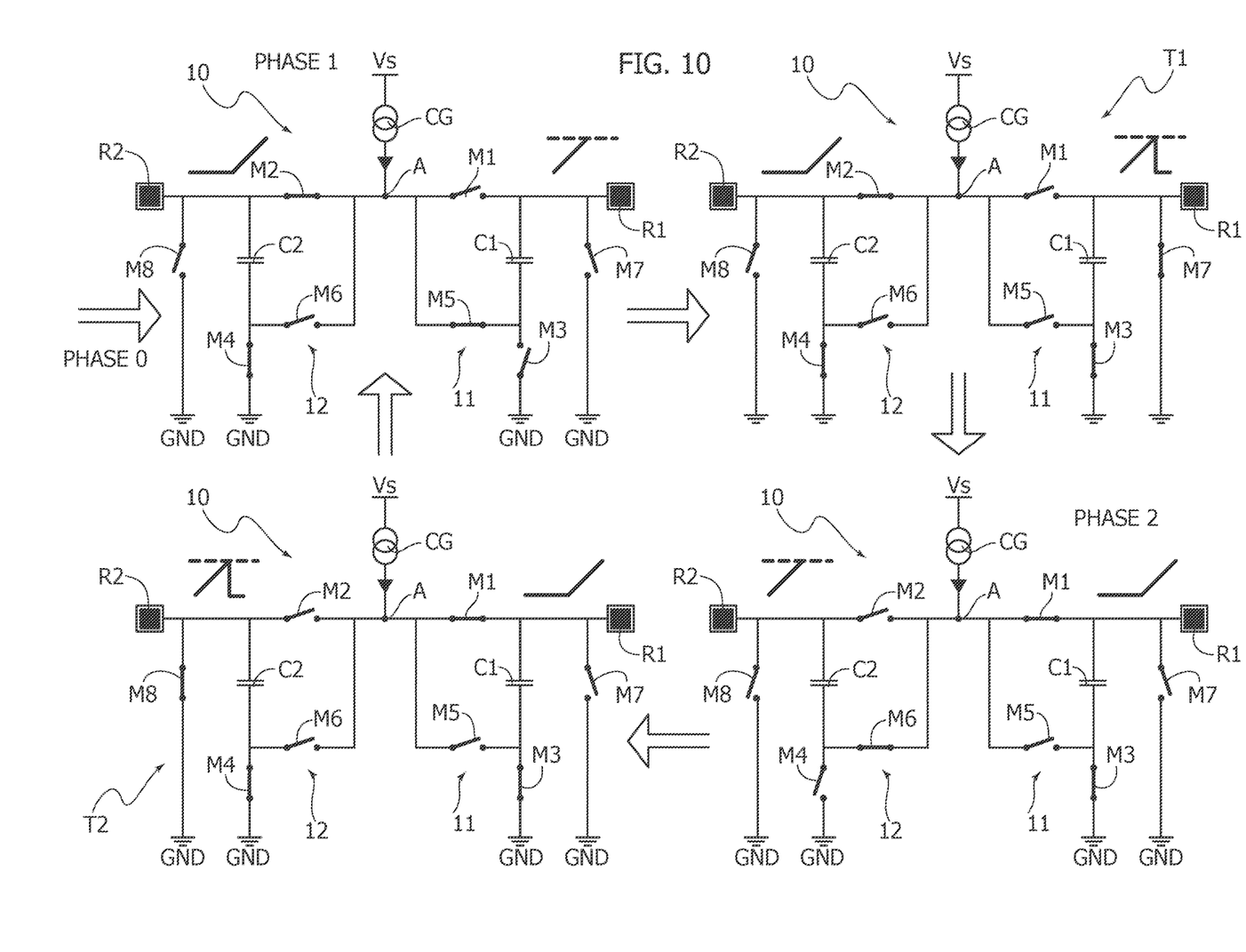
FIG. 10 is exemplary of possible phases of operation of a circuit according to embodiments of the present description.

At steady state, the circuit will toggle cyclically between PHASE 1 and PHASE 2 (with transitions T1 and T2 interleaved therebetween) as illustrated in the "circular" diagram of FIG. 10.

Briefly, the circuit 10 as illustrated is exemplary of a circuit comprising a supply node Vs, a (constant) current generator CG intermediate the supply node Vs and a current node A as well as a first circuit branch 11 and a second circuit branch 12 arranged in parallel intermediate the current node A and ground GND.

As illustrated, the first circuit branch 11 comprises a first output node R1 and a first capacitor C1 having a first ("top") and a second ("bottom") plate and the second circuit branch 12 comprises a second output node R2 and a second capacitor C2 having a first ("top") and a second ("bottom") plate. The first plate of the first capacitor C1 is coupled to the first output node R1 and the first plate of the second capacitor C2 is coupled to the second output node R2

As illustrated, the first circuit branch 11 comprises a first set of switches comprising switches such as M1, M3 and M5 configured to be made alternately conductive and non-conductive to couple and decouple the first (top) plate of the first capacitor C1 with respect to the current node A (switch M1) and to couple and decouple the second (bottom) plate of the first capacitor C1 with respect to the current node A (switch M5) and with respect to ground GND (switch M3).

Furthermore, the second circuit branch 12 comprises a second set of switches comprising switches such as M2, M4 and M6 configured to be made alternately conductive and non-conductive to couple and decouple the first (top) plate of the second capacitor C2 with respect to the current node A (switch M2) and to couple and decouple the second (bottom) plate of the second capacitor C2 with respect to the current node A (switch M6) and with respect to ground GND (switch M4).

As illustrated, the switches in the first set of switches (namely, M1, M3, M5) and in second set of switches (namely M2, M4, M6) are selectively switchable to:

a start-up configuration (PHASE 0 of FIGS. 4 and 5), wherein the first and second plates of the first capacitor C1 are coupled to the current node A and to ground GND, respectively, and the first and second plates of the second capacitor C2 are de-coupled from the current node A (and connected to ground GND);

a first operating configuration (PHASE 1 of FIGS. 6 and 7), wherein the first plate of the first capacitor C1 is de-coupled from the current node A and the second plate of the first capacitor C1 is de-coupled from ground GND and coupled to the second output node R2 via the current node A and the first and second plates of the second capacitor C2 are coupled to the current node A and to ground GND, respectively; and a second operating configuration (PHASE 2 of FIGS. 8 and 9), wherein the first and second plates of the first capacitor C1 are coupled to the current node A and to ground GND, respectively and the first plate of the second capacitor C2 is de-coupled from the current node A and the second plate of the second capacitor C2 is de-coupled from ground GND and coupled to the first output node R1 via the current node A.

As illustrated, the circuit 10 comprises control circuitry 14 coupled to the first set of switches (namely M1, M3, M5) in the first circuit branch 11 and to the second set of switches (namely, M2, M4, M6) in the second circuit branch 12 and configured to switch the first set of switches M1, M3, M5 in the first circuit branch 11 and the second set of switches M2, M4, M6 in the second circuit branch 12: in the start-up configuration of FIGS. 4 and 5, during a start-up phase (PHASE 0) at circuit turn-on; and alternately in the first operating configuration of FIGS. 6 and 7 and in the second operating configuration of FIGS. 8 and 9 in an alternation of first and second operating phases (namely PHASE 1, PHASE 2, with transitions as discussed in the following) after the start-up phase (PHASE 0).

As illustrated, the control circuitry comprises comparator circuitry 14 coupled to the first and second output nodes R1 and R2. In that way, the comparator circuitry 14 is sensitive to the voltages at the first and second output nodes R1, R2.

As illustrated, the comparator circuitry 14 has a first threshold value (e.g., 300 mV) and a second threshold value (e.g., 600 mV) the first threshold value lying between zero and the second threshold value.

As illustrated, the comparator circuitry 14 configured to switch the first set of switches M1, M3, M5 in the first circuit branch 11 and the second set of switches M2, M4, M6 in the second circuit branch (12):

from the start-up configuration (PHASE 0 of FIGS. 4 and 5) to the first operating configuration (PHASE 1 of FIGS. 6 and 7) in response to the voltage at the first output node R1 having varied from zero to the first threshold value;

from the first operating configuration (PHASE 1 of FIGS. 6 and 7) to the second operating configuration (PHASE 2 of FIGS. 8 and 9) in response to the voltage at the first output node R1 having varied from the first threshold value to the second threshold value; and from the second operating configuration (PHASE 2 of FIGS. 8 and 9) back to the first operating configuration (PHASE 1 of FIGS. 6 and 7) in response to the voltage at the second output node R2 having varied from the first threshold value to the second threshold value.

In a circuit 10 as illustrated, the ramp signals R1 and R2 will have a same period $T_{CK}$ proportional to the "full dynamics" voltage (e.g., 600 mV) times the ratio C/I (where I is the intensity of the current from the generator CG and C is the capacitance value C1=C2 of the capacitors C1 and C2) and will be shifted by half period $T_{CK}/2$.

In examples as considered herein, the frequency $1/T_{CK}$ can thus be set (e.g., digitally), for instance via a dedicated trimming of the bias current I and/or by adjusting the capacitance of the capacitors C1, C2, which can be performed in a manner known to those of skill in the art.

A circuit as discussed in the foregoing can be exploited in a DC-DC converter to produce, in addition to two (compensation) ramps such as the ramp signals R1 and R2, also corresponding clock signals (see CLK1 and CLK2 in FIG. 1, for instance) for the two phases.

The clocks can be directly generated in response to the ramp signals R1 and R2 reaching their final value (that is the limit threshold value, e.g., 600 mV). This facilitates achieving a desired final value without dedicated auto-trimming.

For instance, in a Buck-Boost converter the on-time of the clock signal(s) plays a role in defining the maximum "on" time of the high-side switch.

To that effect, the lower threshold in the comparator circuitry 14) can be shifted, e.g., from the "half-dynamics" value indicated previously (300 mV, for instance) to 360 mV (still for instance) in order to facilitate a 10% duty cycle for the clock signal(s). The duty cycle can be therefore chosen modifying the lower threshold accordingly.

For instance, the circuitry 14 can be configured in such a way to: "raise" one of the clock signals CLK1, CLK2 with a rising edge in response to the corresponding ramp signal R1 resp. R2 reaching the "full-dynamics" threshold (e.g., 600 mV), and "lower" it with a falling edge in response to the other ramp signal R2 vs. R1 reaching the "half-dynamics" threshold (e.g., 360 mV).

The corresponding ramp can be maintained at 0 until the clock signal goes low. Such a way of operation can be implemented in a symmetrical way for the other ramp/clock pair.

To that effect, as discussed previously, two additional intermediate transition phases T1 and T2 are introduced between PHASE 1 and PHASE 2 as illustrated in FIG. 10 (PHASE 1>>T1>>PHASE 2 and PHASE 2>>T2>>PHASE 1).

During the transition phase T1, the first capacitor C1 is (completely) discharged via the switches M3 and M7 closed (made conductive) for a short time, for instance, so that both plates of the capacitor C1 are coupled to ground GND.

During the transition phase T2, the second capacitor C2 is (completely) discharged with the switches M4 and M8 closed (that is, made conductive) for a short time, for instance, so that both plates of the capacitor C2 are coupled to ground GND.

These transition phases are beneficial in correctly resetting the capacitors C1 and C2.

Figure 11A:
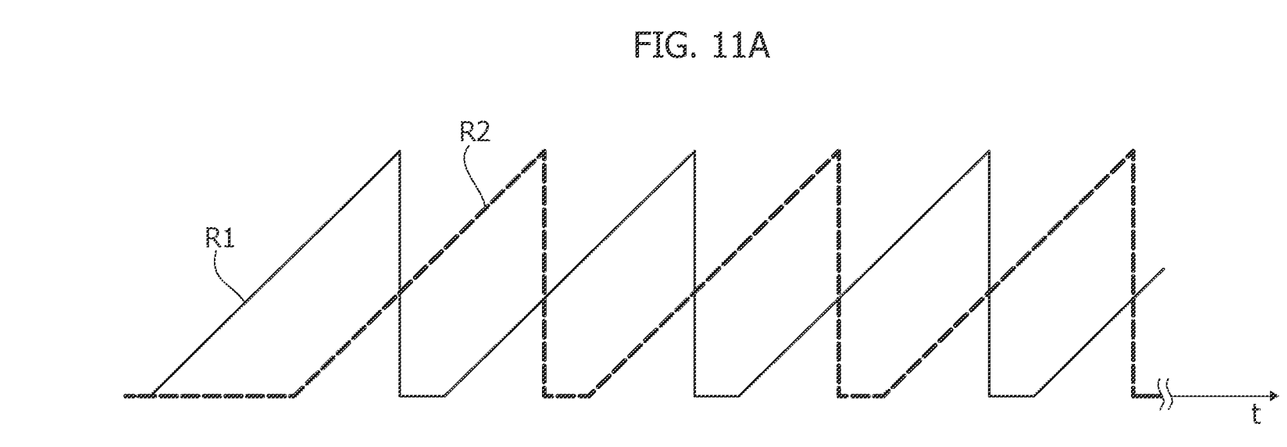
FIGS. 11A and 11B comprise two diagrams exemplary of possible time behaviors of signals produced in the phases of operation illustrated in FIG. 10.
Figure 11B:
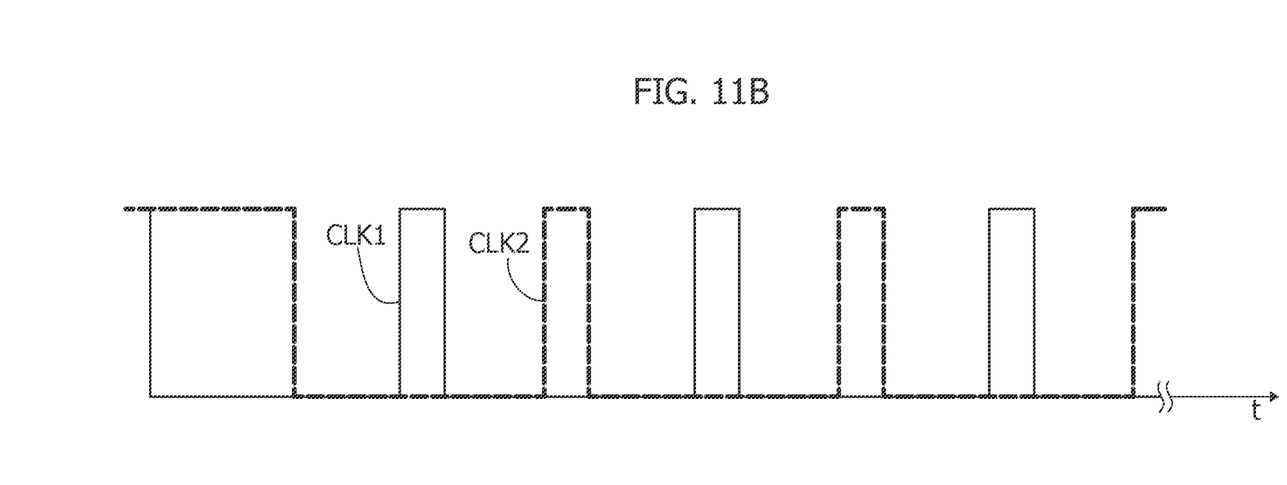

The diagram of FIGS. 11A and 11B are exemplary of possible time behaviors, plotted against a common (abscissa) time scale of two ramp signals R1, R2 and two corresponding clock signals CLK1, CLK2 as generated in a circuit as exemplified herein. The start-up phase (PHASE0) is discernible at the left-hand side of the diagram of FIG. 11B.

Examples as presented herein offer a number of advantages.

As noted, two-phase converters involve two clocks and two ramps shifted in time by a half-period in order to minimize the voltage ripple at the converter output. Conventional solutions are highly power-consuming and area-consuming, in so far as they may need three different current seeds and an auto-trimming structure.

Examples as presented herein facilitate integrating the generation of two ramps and clocks in a single, self-contained structure.

A first advantage of examples as presented herein lies in a reduced area occupation: no "master" clock is implemented to clock the two ramp generators. Moreover, the final ramp voltage value is ensured by design, avoiding an auto-trimming structure and the associated cost in terms area occupation, current consumption and design effort.

Another advantage lies in the reduced power consumption in so far as the switching activity and interconnections between the two capacitors C1 and C2 facilitates generating two ramps using a single current seed. Power consumption is correspondingly reduced.

As noted, auto-trimming becomes unnecessary: the clocks are directly generated by the ramps reaching their final value thus ensuring a correct final value without dedicated auto-trimming.

A reduced area results in a lower number of comparators (e.g., lower bias and lower area).

Easy tunability results in a structure that can be easily trimmed (duty cycle and frequency), merely changing the lower comparator threshold and the current seed (and/or the capacitances C1=C2) respectively.

Figure 12:
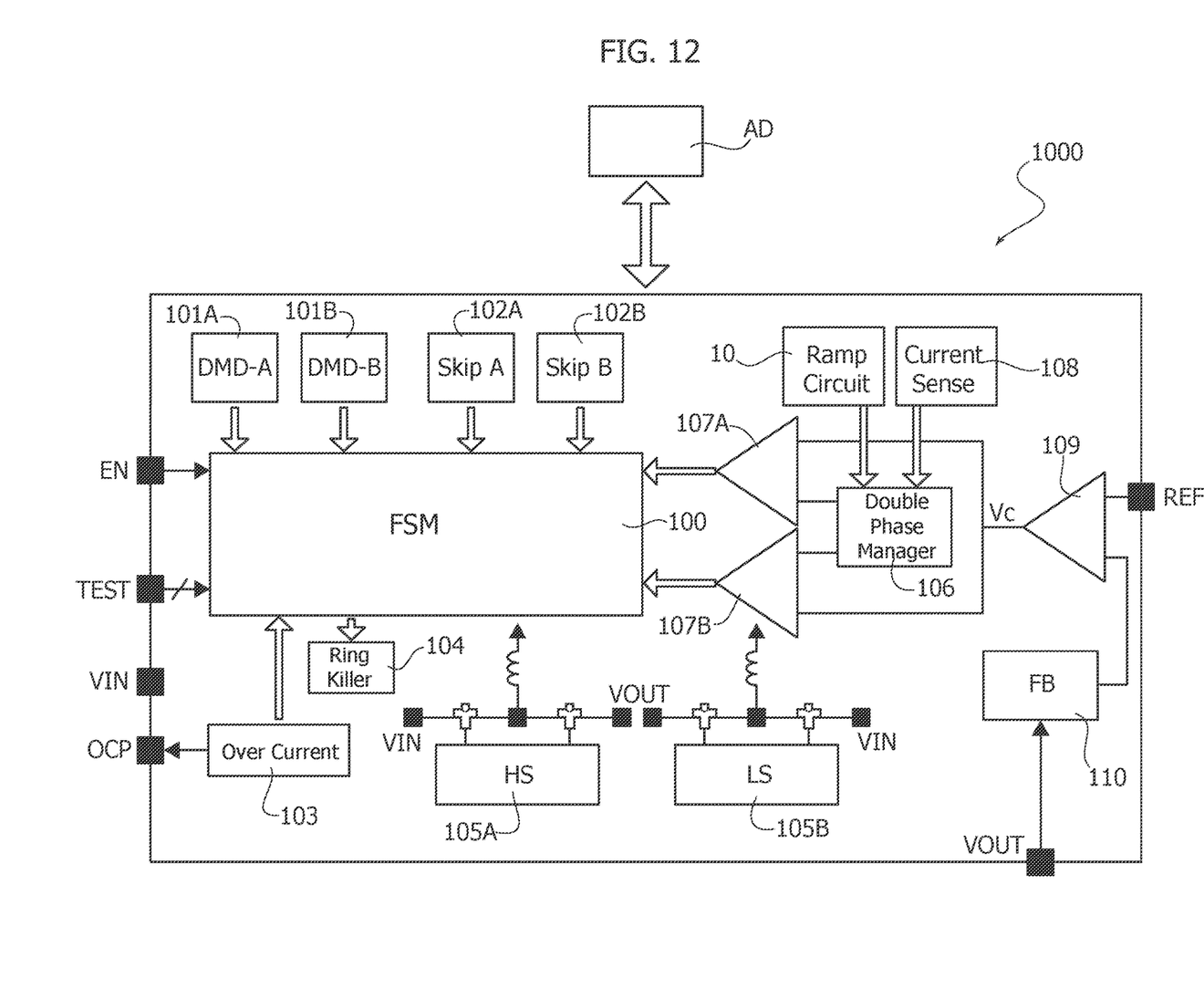
FIG. 12 is a block diagram of a device including a circuit according to embodiments of the present description.

FIG. 12 is exemplary of the possible use of a circuit 10 as exemplified herein as a double clock and ramp generator in a power management IC (PMIC) 1000 suited for use, e.g., as a power supply for an AMOLED device AD.

It is otherwise noted that a circuit 10 as exemplified herein can be used in a variety of multi-phase (e.g., double-phase) DC-DC regulator topologies that benefit from the availability of finely-shifted (compensation) ramps and clocks.

With the exception of the circuit 10, architecture as illustrated in FIG. 12 is otherwise conventional in the art: this makes it unnecessary to provide a more detailed description herein.

The following designations apply to the blocks in the power management IC (PMIC) illustrated in FIG. 12.

VIN: supply pin

100: Finite State Machine (FSM) having enable and test inputs EN and TEST to control the DC-DC converter

101A, 101B: Discontinuous mode detectors (zero current comparators) DMD-A and DMD-B

102A, 102B: SKIP Comparators A and B

103: Over Current Protection OCP and associated pin

104: Ring Killer

105A, 105B: high side (HS) and low side (LS) drivers

106: Double Phase Manager, with clock and ramp input from circuit 10

107A, 107B: Main comparators A and B

108: HS current sense A/B

109: Error amplifier with reference pin REF

110: Feedback (FB) divider with VOUT sensing pin.

Also, it will be appreciated that the set of switches M1, M3, M5, M7 in the first circuit branch 11 and the set of switches M2, M4, M6, M8 in the second circuit branch 12 are just exemplary of switch arrangements suited to implement the connection configurations of the capacitors C1 and C2 described herein; other switch arrangements for the same purposes can be devised by those of skill in the art.

Also, a circuit 10 as exemplified herein lends itself to being implemented with polarities reversed with respect to the examples presented (e.g., with a negative supply voltage Vs and the current generator CG draining current from the current node A).

Without prejudice to the underlying principles, the details and the embodiments may vary, even significantly, with respect to what has been described by way of example only without departing from the scope of the embodiments.

The claims are an integral part of the technical teaching provided herein in respect of the embodiments.

The extent of protection is determined by the annexed claims.

The invention claimed is:

1. A circuit, comprising:
   a current generator configured to source a current to a current node;
   a first switch intermediate the current node and a first output node;
   a second switch intermediate the current node and a second output node;
   a first capacitor having a first plate coupled to the first output node and a second plate coupled to a first intermediate node;
   a second capacitor having a first plate coupled to the second output node and a second plate coupled to a second intermediate node;
   a third switch intermediate the first intermediate node and ground;
   a fourth switch intermediate the second intermediate node and ground;

a fifth switch intermediate the current node and the first intermediate node;

a sixth switch intermediate the current node and the second intermediate node; and a control circuit configured to selectively actuate the first through sixth switches to generate a first current ramp signal at the first output node and a second current ramp signal at the second output node, wherein said first and second current ramp signals have a same period and are out of phase with each other by one-half of said same period.

2. The circuit of claim 1, wherein the current generator is a variable current generator and the current is a variable current controlled to change a frequency of the first and second current ramp signals.

3. The circuit of claim 1, wherein the first and second capacitors are variable capacitors and a capacitance of the first and second capacitors is controlled to change a frequency of the first and second current ramp signals.

4. The circuit of claim 1, wherein the control circuitry comprises comparator circuitry coupled to the first and second output nodes and sensitive to voltages at the first and second output nodes, the comparator circuitry having a first threshold value and a second threshold value, the first threshold value lying between zero and the second threshold value.

5. The circuit of claim 4, wherein the first threshold value in said comparator circuitry is variable to vary a duty-cycle of a first clock signal and a second clock signal generated from the first and second current ramp signals.

6. The circuit of claim 1, wherein said control circuit is configured to operate in a start-up configuration where the first and third switches are closed to connect the first and second plates of the first capacitor to the current node and to ground, respectively, and where the second and sixth switches are open to de-couple the first and second plates of the second capacitor from the current node.

7. The circuit of claim 1, wherein said control circuit is configured to alternately operate in first and second operating configurations wherein:

in the first operating configuration the second, fourth and fifth switches are closed and the first, third and sixth switches are open; and in the second operating configuration the second, fourth and fifth switches are open and the first, third and sixth switches are closed.

8. The circuit of claim 7, further comprising a seventh switch intermediate the first output node and ground, wherein said control circuit selectively actuates the seventh switch to discharge the first capacitor between the first operating configuration and the second operating configuration.

9. The circuit of claim 8, wherein said control circuit selectively actuates the third switch with the seventh switch to discharge the first capacitor.

10. The circuit of claim 7, further comprising an eighth switch intermediate the second output node and ground, wherein said control circuit selectively actuates the eighth switch to discharge the second capacitor between the second operating configuration and the first operating configuration.

11. The circuit of claim 10, wherein said control circuit selectively actuates the fourth switch with the eighth switch to discharge the second capacitor.

12. A circuit, comprising:
a supply node;
a current generator arranged intermediate the supply node and a current node;

a first circuit branch and a second circuit branch arranged in parallel intermediate the current node and ground, wherein the first circuit branch comprises a first output node and a first capacitor having a first plate and a second plate, wherein the first plate of the first capacitor is coupled to the first output node, and wherein the second circuit branch comprises a second output node and a second capacitor having a first plate and a second plate, wherein the first plate of the second capacitor is coupled to the second output node;

a first set of switches in the first circuit branch, the first set of switches comprising switches configured to be made alternately conductive and non-conductive to couple and decouple the first plate of the first capacitor with respect to the current node and to couple and decouple the second plate of the first capacitor with respect to the current node and with respect to ground;

a second set of switches in the second circuit branch, the second set of switches comprising switches configured to be made alternately conductive and non-conductive to couple and decouple the first plate of the second capacitor with respect to the current node and to couple and decouple the second plate of the second capacitor with respect to the current node and with respect to ground;

wherein the switches in the first set of switches and the switches in second set of switches are alternatively switchable between:

a first operating configuration where the first plate of the first capacitor is de-coupled from the current node and the second plate of the first capacitor is de-coupled from ground and coupled to the second output node via the current node and the first and second plates of the second capacitor are coupled to the current node and to ground, respectively; and a second operating configuration where the first and second plates of the first capacitor are coupled to the current node and to ground, respectively and the first plate of the second capacitor is de-coupled from the current node and the second plate of the second capacitor is de-coupled from ground and coupled to the first output node via the current node.

13. The circuit of claim 12, further comprising control circuitry coupled to the first set of switches in the first circuit branch and to the second set of switches in the second circuit branch and configured to switch the first set of switches in the first circuit branch and the second set of switches in the second circuit branch alternately in said first operating configuration and said second operating configuration in an alternation of first and second operating phases.

14. The circuit of claim 13, wherein the control circuitry comprises comparator circuitry coupled to the first and second output nodes and sensitive to the voltages at the first and second output nodes, the comparator circuitry having a first threshold value and a second threshold value, the first threshold value lying between zero and the second threshold value, wherein the comparator circuitry is configured to switch the first set of switches in the first circuit branch and the second set of switches in the second circuit branch:

from the first operating configuration to the second operating configuration in response to the voltage at the first output node rising from the first threshold value to the second threshold value; and from the second operating configuration back to the first operating configuration in response to the voltage at the second output node rising from the first threshold value to the second threshold value.

15. The circuit of claim 14, wherein the first threshold value in said comparator circuitry is selectively variable.

16. The circuit of claim 13, further comprising discharge switches for the first capacitor and the second capacitor, and wherein the control circuitry is configured to activate said discharge switches to:
   discharge the first capacitor in response to the control circuitry switching the first set of switches and the second set of switches from the first operating configuration to the second operating configuration; and
   discharge the second capacitor in response to the control circuitry switching the first set of switches and the second set of switches from the second operating configuration back to the first operating configuration.

17. The circuit of claim 12, wherein said current generator generates a selectively variable current.

18. The circuit of claim 12, wherein a capacitance value of each of the first and second capacitors is selectively variable.

19. A circuit, comprising:
   a supply node;
   a current generator arranged intermediate the supply node and a current node;
   a first circuit branch and a second circuit branch arranged in parallel intermediate the current node and ground, wherein the first circuit branch comprises a first output node and a first capacitor having a first plate and a second plate, wherein the first plate of the first capacitor is coupled to the first output node, and wherein the second circuit branch comprises a second output node and a second capacitor having a first plate and a second plate, wherein the first plate of the second capacitor is coupled to the second output node;
   a first set of switches in the first circuit branch, the first set of switches comprising switches configured to be made alternately conductive and non-conductive to couple and decouple the first plate of the first capacitor with respect to the current node and to couple and decouple the second plate of the first capacitor with respect to the current node and with respect to ground;
   a second set of switches in the second circuit branch, the second set of switches comprising switches configured to be made alternately conductive and non-conductive to couple and decouple the first plate of the second capacitor with respect to the current node and to couple and decouple the second plate of the second capacitor with respect to the current node and with respect to ground;
   wherein the switches in the first set of switches and the switches in second set of switches are selectively switchable to:
      a start-up configuration where the first and second plates of the first capacitor are coupled to the current node and to ground, respectively, and the first and second plates of the second capacitor are de-coupled from the current node;
      a first operating configuration where the first plate of the first capacitor is de-coupled from the current node and the second plate of the first capacitor is de-coupled from ground and coupled to the second output node via the current node and the first and second plates of the second capacitor are coupled to the current node and to ground, respectively; and
      a second operating configuration where the first and second plates of the first capacitor are coupled to the current node and to ground, respectively and the first plate of the second capacitor is de-coupled from the current node and the second plate of the second capacitor is de-coupled from ground and coupled to the first output node via the current node; and
   wherein the circuit comprises control circuitry coupled to the first set of switches in the first circuit branch and to the second set of switches in the second circuit branch and configured to switch the first set of switches in the first circuit branch and the second set of switches in the second circuit branch:
      in said start-up configuration during a start-up phase at circuit turn-on; and
      alternately in said first operating configuration and said second operating configuration in an alternation of first and second operating phases following said start-up phase.

20. The circuit of claim 19, wherein the control circuitry comprises comparator circuitry coupled to the first and second output nodes and sensitive to the voltages at the first and second output nodes, the comparator circuitry having a first threshold value and a second threshold value, the first threshold value lying between zero and the second threshold value, wherein the comparator circuitry is configured to switch the first set of switches in the first circuit branch and the second set of switches in the second circuit branch:
   from the start-up configuration to said first operating configuration in response to the voltage at the first output node rising to the first threshold value;
   from the first operating configuration to the second operating configuration in response to the voltage at the first output node rising from the first threshold value to the second threshold value; and
   from the second operating configuration back to the first operating configuration in response to the voltage at the second output node rising from the first threshold value to the second threshold value.

21. The circuit of claim 20, wherein the first threshold value in said comparator circuitry is selectively variable.

22. The circuit of claim 19, wherein said current generator generates a selectively variable current.

23. The circuit of claim 19, wherein a capacitance value of each of the first and second capacitors is selectively variable.

24. The circuit of claim 19, further comprising discharge switches for the first capacitor and the second capacitor, and wherein the control circuitry is configured to activate said discharge switches to:
   discharge the first capacitor in response to the control circuitry switching the first set of switches and the second set of switches from the first operating configuration to the second operating configuration; and
   discharge the second capacitor in response to the control circuitry switching the first set of switches and the second set of switches from the second operating configuration back to the first operating configuration.

25. The circuit of claim 19:
   wherein said first set of switches comprises:
      a first switch intermediate the current node and the first output node in the first circuit branch;
      a third switch intermediate the second plate of the first capacitor in the first circuit branch and ground; and
      a fifth switch intermediate the current node and the second plate of the first capacitor in the first circuit branch; and
   wherein said second set of switches comprises:
      a second switch intermediate the current node and the second output node in the second circuit branch;

a fourth switch intermediate the second plate of the second capacitor in the second circuit branch and ground; and a sixth switch intermediate the current node and the second plate of the second capacitor in the second circuit branch.

26. The circuit of claim 25, further comprising:

a seventh switch intermediate the first output node in the first circuit branch and ground, wherein the third switch and the seventh switch provide discharge switches for the first capacitor in the first circuit branch, and an eight switch intermediate the second output node in the second circuit branch and ground, wherein the fourth switch and the eighth switch provide discharge switches for the second capacitor in the second circuit branch.

27. A device, comprising:

a circuit according to claim 19; and a multi-phase circuit block coupled to said first output node and to said second output node to collect from said first output node and said second output node a first ramp signal and a second ramp signal, respectively, the first ramp signal and the second ramp signal having a same frequency and a same period, the first ramp signal and the second ramp signal mutually offset half said same period, wherein the multi-phase circuit block is coupled to said control circuitry to collect therefrom, at the alternation of said first and second operating phases following said start-up phase, a first clock signal and a second clock signal having said same frequency of the first ramp signal and the second ramp signal.

28. A method of operating a circuit according to claim 19, the method comprising:

turning on the circuit, wherein the circuit enters said start-up phase followed by said alternation of first and second operating phases following said start-up phase; and during said alternation of first and second operating phases:

collecting from said first output node and said second output node a first ramp signal and a second ramp signal, respectively, the first ramp signal and the second ramp signal having a same frequency and a same period, the first ramp signal and the second ramp signal mutually offset half said same period; and collecting from said control circuitry, at the alternation of said first and second operating phases following said start-up phase, a first clock signal and a second clock signal having said same frequency of the first ramp signal and the second ramp signal.

29. The method of claim 28, wherein the control circuitry comprises comparator circuitry coupled to the first and second output nodes and sensitive to the voltages at the first and second output nodes, the comparator circuitry having a first threshold value and a second threshold value, the first threshold value lying between zero and the second threshold value, the method further comprising varying the first threshold value in said comparator circuitry to vary the duty-cycle of said first clock signal and said second clock signal.

30. The method of claim 28, further comprising varying an intensity of current generated by said current generator to vary said same frequency of the first clock signal and the second clock signal and of the first ramp signal and the second ramp signal.

31. The method of claim 28, further comprising varying a capacitance value of the first and second capacitors to vary said same frequency of the first clock signal and the second clock signal and of the first ramp signal and the second ramp signal.

* * * * *